United States Patent Office 3,829,334

Patented Aug. 13, 1974

3,829,334

METHOD OF MANUFACTURE OF A SUPERCONDUCTING MATERIAL

Nikolai Alexandrovich Vitovsky, ulitsa Babushkina 53, kv. 67; Georgy Alexandrovich Vikhly, ulitsa Yakovskaya 8; Tatyana Vadimovna Mashovets, prospekt Morisa Toresa 9; and Solomon Meerovich Ryvkin, Olginszaya ulitsa 9, kv. 9, all of Leningrad, U.S.S.R.

No Drawing. Filed July 24, 1972, Ser. No. 274,294
Claims priority, application U.S.S.R., July 23, 1971, 1679307
Int. Cl. C22f *1/00*
U.S. Cl. 148—125 3 Claims

ABSTRACT OF THE DISCLOSURE

A method of manufacturing a superconducting material from a semiconducting material, such as InSb consisting in that the semiconducting material is first cooled to a temperature which is not higher than 200° K., then microscopic spots on the surface of the semiconducting material are subjected to pressures which are higher than the critical pressure for the semiconductor-metal structural phase transition; these pressures are then relieved.

BACKGROUND OF THE INVENTION

The present invention relates to methods of manufacturing superconducting structures and more specifically it relates to a method of manufacture of a superconducting material.

Known at present is a method of manufacture of a superconducting material consisting in producing special alloys based on superconducting components.

However, this method is extremely complicated, the difficulties in producing alloys being attributable to the complexity of their composition, for example $$(Nb_s3n)_4(Nb_3Al).$$

Also known in the art is a method of manufacturing a superconducting material by creating thin films of a superconducting material or making systems of thin alternating layers of superconducting and non-superconducting materials of the "sandwich" type.

The sufficiently thin films (10–40 A.) can be obtained, for example, by evaporating aluminium at a low temperature on a cold backing ($t$=125° K.) in oxygen at a low pressure ($10^{-5}$ torrs). This process is highly involved while the methods of producing periodic sandwich-type structures are still more involved. Besides, both methods are unsuitable for producing the superconducting state of a material which was not previously superconducting.

Also known in the art is a method of obtaining the superconducting state of semiconducting materials Type GeTe, $SrTiO_2$ which have not previously been superconducting, this method consisting in heavy alloying of the source material. In this method the material must be alloyed to a hole concentration of $1.5 \cdot 10^{21}$ cm.$^{-3}$ by creating vacancies at Ge points and alloying $SrTiO_3$ up to $3.3 \cdot 10^{19}$ cm.$^{-3}$. The critical temperatures $T_c$ of the superconducting states obtained by this method are 0.3° K. for GeTe, 0.28° K. for $SrTiO_3$.

The disadvantages of the last method consists in its complexity, because alloying must be carried out to extremely high concentrations with the use of complex special equipment; additionally the obtained values of the critical temperature $T_c$ are very low.

The method of manufacture of a superconducting material from a semiconducting material Type $A'''B^v$ which is closest to our invention is the method in which a specimen of a semi-conducting material is subjected to uniform compression under a pressure which is higher than the critical pressure for the semiconductor-metal structural phase transition and reaches several tens of kilobars (A. J. Darnell, W. F. Libby, Phys. Rev. 135, No. 5A, A1453, 1964).

The disadvantages of this method include the use of complex equipment for building up high pressures and the fact that in this method the entire volume of the semiconducting material becomes superconducting which limits its practical utilization.

SUMMARY OF THE INVENTION

An object of the invention is to provide a method of manufacturing a superconducting material which allows producing superconducting spots of any desired shape on the surface of solid semiconducting specimens, such spots being characterized by a sufficiently high $T_c$, which would be technologically simple and would not call for the use of complex equipment.

This object is achieved by providing a method of obtaining a superconducting material from a semiconducting material, InSb by applying to the semiconducting material a pressure higher than the critical pressure for the semiconductor-metal structural phase transition wherein, according to the invention, the semiconducting material is first cooled to a temperature which is not higher than the temperature of the metal-semiconductor structural phase transition after which microscopic spots of its surface are subjected to these pressures which are subsequently relieved. The expression "microscopic spots" is used herein to describe any areas forming superconducting surfaces of required configuration, and also areas which ensure that the specimen as a whole is not destroyed when a pressure, in excess of the critical value for the semiconductor-metal structural phase transition, is applied to these areas. The size of these spots is determined by the edge angle of the cutting tool (cutter or abrasive grains).

It is expedient that these pressures be created by grinding the surface of the semiconducting material with an abrasive material.

It is also possible to create the same pressures by scratching the surface of the semiconducting material with any suitable tool, i.e. a cutter.

The method of manufacture of a superconducting material from a semiconducting material according to the present invention does not call for the use of complex technological equipment and makes it possible to create on the surface of solid semiconducting specimens superconducting spots of any desired shape, in any sequence. The shape of the machined surface can also be of any desired configuration. The last factor permits a fundamental possibility of using the method according to the invention for applying superconducting coatings of various configurations, for example "drawing" various circuits incorporating superconducting elements.

The semiconducting base on which superconducting spots are produced makes it fundamentally possible to evolve a number of devices whose essential feature is the use of a combination of semiconducting and superconducting elements, for example devices with nonlinear and falling volt-ampere characteristics.

Now the invention will be made more apparent by a detailed description of the method according to the invention.

A solid specimen of a semiconducting material, InSb is cooled to a temperature which is not higher than the temperature of the metal-semiconductor structural phase transition which is not higher than 200–250° K. for the semiconductors of this type. The specimen can be cooled by putting it into a bath with a coolant, e.g. liquid nitrogen. Then, microscopic spots on the surface of the semiconductor specimen are subjected to a pressure which is higher than the critical pressure for the semiconductor-metal structural phase transition.

This pressure is produced by grinding the surface of the specimen with any known abrasive material such as emery paper or abrasive powder. The size of abrasive grains is of no practical importance.

Should it become necessary to produce only limited super-conducting spots on the suface of the semiconducting specimen, the above pressure can be created by making individual scratches on the spots with any suitable tool, e.g. a steel or diamond cutter. Then the abrasive material or cutter is removed.

As a result of the above-described treatment, the surface of the semiconducting material at the treated spots becomes covered with a thin layer (several tens of A.) of a superconducting material. The treated specimen is stored until required at a temperature not exceeding 200–250° K.

For better understanding of the essence of the present invention an actual example will now be described of the method of manufacture of a superconducting material according to the invention.

A specimen of indium antimonide of n-type or p-type conductivity with a current carrier concentration $$n=10^{13}\text{–}10^{15}\ \text{cm.}^{-3}$$

and $p=10^{13}$–$10^{15}$ cm.$^{-3}$ is placed into a liquid nitrogen bath with a temperature of about 78° K. Then a sheet of emery paper, grain size 10–40 microns, is placed into the same bath and the specimen surface is ground directly in the coolant.

As an alternative, the same specimen placed into a liquid nitrogen bath is scratched with a steel scriber subjected to a load of 50–200 g.

As a result of this treatment, the surface of the specimen of indium antimonide becomes covered at the points of grinding with thin layers (about 100 A.) of a superconducting material or (after the second kind of treatment) with superconducting "threads" whose visible width is 10–100 microns.

The superconducting material manufactured by the above-described method is characterized by a critical temperature $T_c$=4.9° K. and a critical magnetic field $H_c$=12.5 kilogauss at $T$=4.2° K.

If such a specimen is kept in liquid nitrogen, it will retain for long periods the ability of turning into a superconducting state being cooled to a critical temperature $T_c$.

The high-temperature boundary (200–250° K.) of the existence of the superconducting material makes it easy to "erase" easily, by heating, the previously created configuration of superconducting elements and to apply a new combination of such elements after cooling the specimen to a temperature below 200–250° K.

Inasmuch as the critical temperature $T_c$ of transition for the superconducting indium antimonide produced by the above-described method is 4.9° K., the instruments manufactured in accordance with this method can be used in liquid helium at an atmospheric pressure ($T$=4.2° K.).

What is claimed is:

1. A method of manufacturing a super conducting material from a semiconducting material, InSb comprising the steps of: cooling the semiconducting material to a temperature not higher than 200° K.; subjecting microscopic spots on the surface of said semiconducting material to pressures which are higher than the critical pressure for the semiconductor-metal structural phase transition; relieving said pressures to which the semi-conductor material is subjected.

2. A method of manufacture of a superconducting material according to Claim 1 wherein said pressures to which the microscopic spots are subjected are created by grinding the surface of said semiconducting material with an abrasive material.

3. A method of manufacture of a superconducting material according to Claim 1 wherein said pressures to which the microscopic spots are subjected are created by making scratches on the suface of said semiconducting material.

References Cited

The Journal of Chemical Physics, vol. 45, No. 7, Oct. 1, 1966, pp. 2508–2511.

Journal of Applied Physics, vol. 38, No. 5, April 1967, pp. 2042, 2044–2046.

Modern Very High Pressure Techniques, Butterworth, New York, 1962, Wentorf, pp. 175–179.

U.S. Cl. XL.

148—4, 11.5 R; 335—216